United States Patent
Hsu et al.

(10) Patent No.: US 7,396,762 B2
(45) Date of Patent: Jul. 8, 2008

(54) INTERCONNECT STRUCTURES WITH LINEAR REPAIR LAYERS AND METHODS FOR FORMING SUCH INTERCONNECTION STRUCTURES

(75) Inventors: Louis Lu-Chen Hsu, Fishkill, NY (US); Jack Allan Mandelman, Flat Rock, NC (US); William Robert Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 11/468,392

(22) Filed: Aug. 30, 2006

(65) Prior Publication Data

US 2008/0122090 A1 May 29, 2008

(51) Int. Cl.
*H01L 21/4763* (2006.01)
(52) U.S. Cl. .................. 438/639; 438/637; 438/640; 438/638; 438/622; 257/E23.168
(58) Field of Classification Search ................. 438/637, 438/640, 639, 638
See application file for complete search history.

(56) References Cited

U.S. PATENT DOCUMENTS

| 4,184,909 A | 1/1980 | Chang et al. |
| 5,933,753 A | 8/1999 | Simon et al. |
| 5,985,762 A | 11/1999 | Geffken et al. |
| 6,429,519 B1 | 8/2002 | Uzoh |
| 6,794,940 B2 | 9/2004 | Suzuki |
| 2003/0207560 A1 | 11/2003 | Dubin et al. |
| 2005/0112864 A1 | 5/2005 | Clevenger et al. |

FOREIGN PATENT DOCUMENTS

JP 2006216787 A2 8/2006

*Primary Examiner*—Tom Thomas
*Assistant Examiner*—Chakila Tillie
(74) *Attorney, Agent, or Firm*—Wood, Herron & Evans, LLP (57) ABSTRACT

Interconnect structures that include a conformal liner repair layer bridging breaches in a liner formed on roughened dielectric material in an insulating layer and methods of forming such interconnect structures. The conformal liner repair layer is formed of a conductive material, such as a cobalt-containing material. The conformal liner repair layer may be particularly useful for repairing discontinuities in a conductive liner disposed on roughened dielectric material bordering the trenches and vias of damascene interconnect structures.

27 Claims, 10 Drawing Sheets

INTERCONNECT STRUCTURES WITH LINEAR REPAIR LAYERS AND METHODS FOR FORMING SUCH INTERCONNECTION STRUCTURES

FIELD OF THE INVENTION

The invention relates generally to the fabrication of integrated circuits and, in particular, to methods of fabricating interconnect structures for integrated circuits and interconnect structures formed by the methods.

BACKGROUND OF THE INVENTION

Progressive scaling of the feature sizes and critical dimensions of semiconductor devices has advanced the performance and increased the functional capability and device density of integrated circuits formed in and on semiconductor substrates or wafers. Back end of line (BEOL) interconnect structures have been developed that complement advances in device density by more effectively routing signal paths between the constituent semiconductor devices. Circuit performance may eventually be limited by the signal-transmission effectiveness and efficiency of the interconnect structure.

Back end of line operations are performed on the semiconductor substrate in the course of device manufacturing following first metallization. In a multilevel metallization network or scheme, the interconnect structure usually employs two or more separate levels of conductive lines that extend laterally across the substrate. Insulating layers of dielectric material separate and electrically isolate the different conductive line levels. Adjacent levels of conductive lines are connected by conductive contacts extending through dielectric material separating those adjacent levels.

The conductive lines and the contacts that connect conductive lines in different levels operate to distribute signals among the devices and integrated circuits on the substrate. Ordinarily, the conductive lines of the first metallization, which are in the initial level closest to the substrate, primarily interconnect the devices of the integrated circuit and may provide circuit-to-circuit connections. The conductive lines in the upper levels complete the circuit-to-circuit connections and make contact with input and output terminals coupled with a support such as a module, substrate or card.

The signal propagation delay of the interconnect structure depends upon the resistance of the interconnect lines and contacts and upon the overall capacitance of the dielectric materials in which the conductive lines and contacts are embedded. The resistance contribution to the signal propagation delay may be reduced by using copper (Cu) as the constituent conductor for the conductive lines and contacts. The capacitance contribution to the signal propagation delay may be reduced by using low dielectric constant (k) dielectrics having a dielectric constant, k, of about 3.9 or less. In particular, the combination of copper metal and low-k dielectric materials has been found to minimize signal propagation delay particularly well as feature sizes and critical dimensions are scaled below 90 nm.

Copper-dielectric BEOL interconnect structures are routinely fabricated by damascene processes that rely on standard lithographic and dry etch techniques. In single damascene processes, vias are selectively etched in a dielectric layer masked by a patterned resist. After the resist is stripped, the vias are filled with metal to establish contacts with underlying conductor lines or other conductive structures. Trenches are then etched in another patterned layer of dielectric material deposited on the initial dielectric layer and subsequently filled with metal to define overlying conductor lines. The overlying and underlying conductive lines are electrically coupled by the contacts in the vias. Dual-damascene processes differ in that the trenches and vias are etched in one or more layers of insulating or dielectric material and then filled simultaneously by a single blanket deposition of metal. Repeating these damascene processes forms subsequent levels of the interconnect structure.

Conventional copper-dielectric interconnect structures include a conductive liner situated between the dielectric material and the conductive lines and contacts. In particular, the use of copper metal in interconnect manufacture requires an adhesion layer between the copper metal and the dielectric material to promote bonding and a diffusion barrier between the copper metal and the dielectric material to isolate the copper from the dielectric material. Conventionally, a bilayer liner of TaN/Ta may be deposited on the dielectric material bordering the vias and the trenches. The TaN/Ta bilayer liner has proven to be a reliable barrier for copper interconnects that isolates the conductive copper metal from the low-k dielectric material as well as adhering firmly to the conductive metal and the dielectric material. After the vias and the trenches are lined with the TaN/Ta bilayer liner, a copper seed layer is deposited for facilitating the ensuing copper plating process that forms copper contacts in the via and trench features.

As the critical dimensions of interconnect structures continue to scale downwardly, the thickness of both the liner and copper seed layers must likewise scale to maintain circuit performance. If the liner and copper seed layers are kept at a fixed dimension, the interconnect layers themselves will shrink disproportionately to the critical dimension. Integrated circuit performance would suffer because of an increased signal propagation delay. Moreover, top pinch-off may eventually occur in the narrowed vias and trenches during the subsequent copper plating process, which has the potential to trap an unfilled void within the bulk of the deposited copper.

During the metallization process, various antecedent steps are employed to ensure high yield and reliability of the interconnect structure. One such step is a directional non-selective sputter etch preclean, often performed using argon ions, that removes native copper oxide, and other possible contaminants, from the copper line exposed at the via bottom. This sputter etch preclean has a tendency to breach the liner at the via and trench bottoms and, subsequently, etch the conductor and/or dielectric material of the underlying interconnect level. Conductive materials like copper, which have a high sputter yield, are then susceptible to erosion by sputter etching. Diffusion of metals like copper into the dielectric material may compromise the integrity of the dielectric materials in the insulating layers isolating the levels of the interconnect structure. Metal contamination of the dielectric material may result in leakage currents among the interconnect layers.

To alleviate the effect of sputtered metal, an initial barrier layer of the liner may be deposited on the sidewalls and bottom of the vias and trenches of the overlying level in the interconnect structure before performing the sputter etch preclean. The barrier layer intervenes between the dielectric material and the sputtered copper that deposits on the via sidewalls, trench sidewalls, and trench bottom. The sputter etch preclean may gouge out or roughen sections of the underlying interconnect level exposed at the via bottoms. Subsequently-deposited layers of the liner cannot adequately repair the physical damage without resorting to a layer thickness that fails to scale with the critical dimensions of interconnect structures. Because of the roughening, the subsequently-deposited layers of the liner are not deposited in a conformal manner on the dielectric material. The thickness-limited result may be a discontinuous liner, which may permit diffusion of sputtered and re-deposited metal into the dielectric material bordering the vias and trenches in the overlying level of the interconnect structure.

What is needed, therefore, are interconnect structures and methods of fabricating interconnect structures that repair damage to the via and trench liner arising from the sputter etch preclean process.

SUMMARY OF THE INVENTION

An embodiment of the invention is directed to interconnect structures that include an insulating layer of a dielectric material, a trench having a bottom that opens on a roughened portion of the dielectric material in the insulating layer, and a conductive line disposed in the trench. A liner is disposed on the bottom of the trench and between the insulating layer and the conductive line. The liner includes a discontinuities distributed across the roughened portion of the dielectric layer. A conformal liner repair layer of conductive material bridges the discontinuities in the liner.

In specific embodiments, the conductive material may be a cobalt-containing material. In other specific embodiments, the dielectric material of the insulating layer may have a dielectric constant of about 2.6 or less. In yet other specific embodiments, the conformal layer has a thickness of less than or equal to about 5 nanometers and a width between the trench sidewalls at the bottom of the trench is less than, or equal to, about 90 nanometers. The invention contemplates that a conformal layer may be used to bridge similar discontinuities formed in a liner covering roughened dielectric material located at the bottom of a via.

In another embodiment of the invention, a method of forming an interconnect structure includes forming a trench in an insulating layer having a bottom that opens on a dielectric material constituting the insulating layer. The method further includes at least partially covering the bottom of the trench with a liner layer having discontinuities that expose the dielectric material of the insulating layer and conformally forming a liner repair layer that bridges the discontinuities in the liner layer. A conductive line may be subsequently formed in the trench. The conductive line is separated from the dielectric material of the insulating layer at the bottom of the trench by at least the conformal liner repair layer. Alternatively, the invention contemplates a similar method that relies on a conformal layer to bridge discontinuities formed in a liner layer covering roughened dielectric material located at the bottom of a via.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
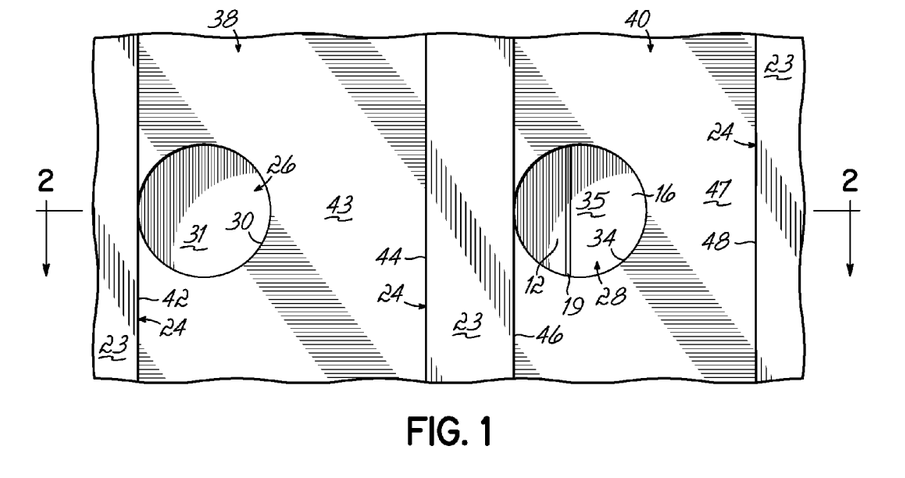
FIG. 1 is a diagrammatic top view of a portion of a substrate at an initial fabrication stage of a processing method in accordance with an embodiment of the invention.
Figure 2:
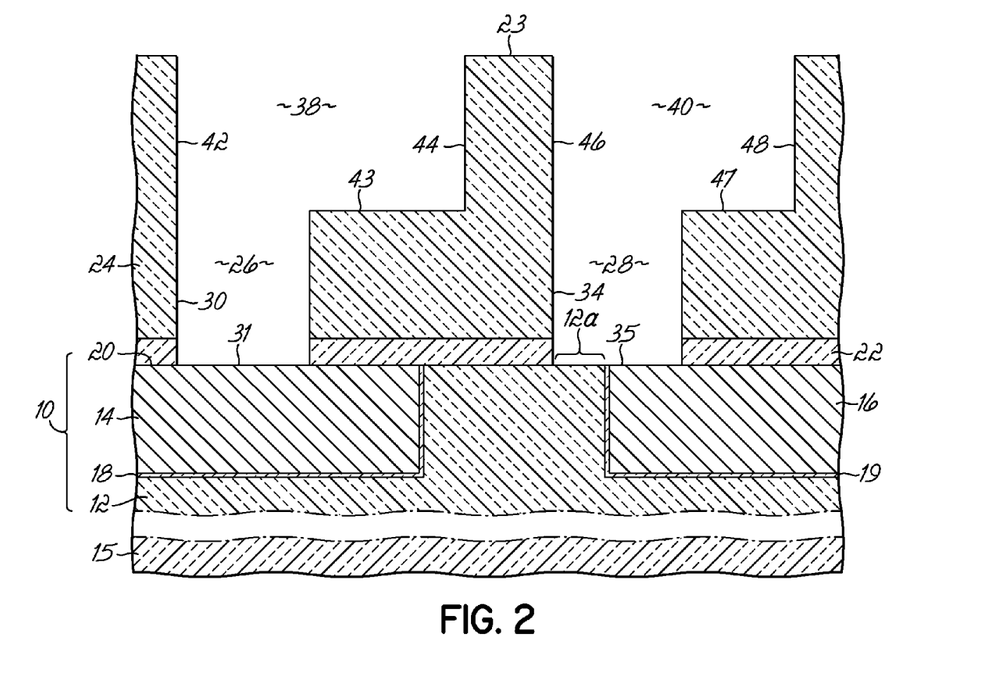
FIG. 2 is a diagrammatic cross-sectional view taken generally along line 2-2 of FIG. 1.

With reference to FIGS. 1 and 2, a planarized first interconnect level 10 is formed by standard damascene back end of line processing on a substrate 15. Substrate 15 may include various circuits and/or devices (not shown) formed thereon and/or therein that are interconnected by the first interconnect level 10. The first interconnect level 10 includes an insulating layer 12 constituted by a dielectric material and a plurality of conductive lines, of which two representative conductive lines 14, 16 are visible in FIG. 2, constituted by a conductor. The conductive lines 14, 16 are embedded in the insulating layer 12 and are planarized by, for example, a conventional chemical-mechanical polishing (CMP) process to define a featureless top surface 20. Liners 18, 19 separate the conductor forming the conductive lines 14, 16, respectively, from the dielectric material of the surrounding insulating layer 12.

Suitable conductors for conductive lines 14, 16 include, but are not limited to, copper (Cu), aluminum (Al), tungsten (W), silver (Ag), alloys of these metals, and other similar metals, which may be deposited by conventional deposition processes such as chemical vapor deposition (CVD), plasma-enhanced CVD, an electrochemical process such as electroplating or electroless plating, chemical solution deposition, physical vapor deposition (PVD), direct current (DC) or radio frequency (RF) sputtering, and the like. The liners 18, 19 may include any material or multilayer combination of materials recognized by a person having ordinary skill in the art to prevent diffusion of the conductor of the conductive lines 14, 16 into the insulating layer 12. Exemplary materials for liners 18, 19 include, but are not limited to titanium nitride (TiN), tantalum nitride (TaN), titanium (Ti), an alloy (TaRu) of tantalum and ruthenium, tungsten (W), tungsten nitride (WN), chromium (Cr), niobium (Nb), and other like materials. The material constituting liners 18, 19 may be formed in the trenches filled by conductive lines 14, 16 utilizing conventional deposition processes well known to those skilled in the art, including but not limited to PVD, ionized-PVD (iPVD), Atomic Layer Deposition (ALD), plasma-assisted ALD, CVD, and plasma-assisted CVD to deposit a liner layer that is subsequently shaped to define the individual liners 18, 19.

An etch stop layer 22, typically ranging from about 10 nm to about 50 nm in thickness, is then formed on the first interconnect level 10 to facilitate etch selectivity in subsequent patterning steps. The etch stop layer 22 may be composed of any of several different hard mask materials, such as silicon nitride or silicon dioxide, deposited by conventional PVD or CVD techniques. An insulating layer 24 constituted by a dielectric material is deposited on the etch stop layer 22.

The insulating layers 12, 24 may be deposited by a conventional method, such as a spin-on application, understood by a person having ordinary skill in the art. The dielectric material constituting insulating layers 12, 24 may be characterized by a relative permittivity or dielectric constant smaller than the dielectric constant of silicon dioxide, which is about 3.9. Alternatively, the dielectric material may be characterized by a dielectric constant of about 2.6 or less. Candidate low-k dielectric materials for insulating layers 12, 24 include, but are not limited to, porous and nonporous spin-on organic low-k dielectrics, such as the spin-on aromatic thermoset polymer SiLK commercially available from Dow Chemical Co. (Midland, Mich.) and having a dielectric constant of about 2.6 if nonporous and about 2.2 if porous, porous and nonporous inorganic low-k dielectrics, such as CVD organosilicates, and combinations of organic and inorganic dielectrics. Fabricating the insulating layers 12, 24 from low-k materials may operate to lower the capacitance of the completed interconnect structure as understood by a person having ordinary skill in the art. Alternatively, the dielectric material constituting insulating layers 12, 24 may comprise silicon oxide, fluorine-doped silicon glass (FSG), and combinations of these materials either with themselves or with a low-k dielectric material.

Vias, of which vias 26, 28 are representative, are formed in the insulating layer 24 and the etch stop layer 22 using a conventional lithography and etch operation characteristic of a damascene process. To that end, a resist layer (not shown) is applied to a top surface 23 of the insulating layer 24, exposed to radiation to impart a latent image of a via pattern, and developed to transform the latent image via pattern into a final image pattern with areas of insulating layer 24 unmasked at the future locations of vias 26, 28. Volumes of the dielectric material in the unmasked regions of insulating layer 24 are removed by an etching process, such as plasma etching or reactive ion etching (RIE), capable of producing substantially vertical via sidewalls. The etching process is continued with a different etch chemistry to extend the vias 26, 28 through the etch stop layer 22 to the depth of the first interconnect level 10. After the etching process is concluded, the residual resist is stripped from insulating layer 24 by, for example, plasma ashing or a chemical stripper.

Via 26 includes one or more sidewalls 30 extending through insulating layer 24 towards substrate 15. A bottom 31 that opens on, and is therefore fully landed on, conductive line 14 terminates sidewall 30. Similarly, via 28 includes one or more sidewalls 34 extending through insulating layer 24 toward substrate 15. Sidewall 34 is terminated by a bottom 35 that opens on, and is therefore only partially landed on, conductive line 16. The bottom 35 of via 28 is also partially landed on a portion 12a of the insulating layer 12 adjacent to the conductive line 16. The misalignment between via 28 and conductive line 16, which may or may not be present for any particular one of the representative vias 26, 28, is shown for purposes of illustrating the repair of a portion 12a of the underlying insulating layer 12 damaged by a sputtering etching operation.

Troughs or trenches, of which trenches 38, 40 are representative, are formed in the insulating layer 24 using another conventional lithography and etch operation. To that end, a resist layer (not shown) is then applied to cover the top surface 23 of insulating layer 24, exposed to impart a latent image pattern characteristic of trenches 38, 40, and developed to transform the latent trench image pattern into a final image pattern having unmasked areas that expose insulating layer 24 at the future locations of trenches 38, 40. Volumes of the dielectric material in the unmasked area of insulating layer 24 are removed by an etching process, such as plasma etching or RIE, capable of producing substantially vertical via sidewalls. After the etching process is concluded, residual resist is stripped from insulating layer 24 by, for example, plasma ashing or a chemical stripper.

Trench 38 includes sidewalls 42, 44 that extend substantially vertically in the insulating layer 24 from the top surface 23 to a bottom 43 of trench 38 located at a horizontal level or depth between the top surface 23 and the insulating layer 12. Similarly, trench 40 includes sidewalls 46, 48 that extend substantially vertically in the insulating layer 24 from the top surface 23 to a bottom 47 of trench 40 located at a depth between the top surface 23 and the insulating layer 12. Generally, the depths of the trench bottoms 43, 47 are approximately equal. The bottom 43 of trench 38 connects sidewalls 42, 44 and, similarly, the bottom 47 of trench 40 connects sidewalls 46, 48. Sidewall 30 of via 26 is generally aligned or registered vertically between the sidewalls 42, 44 of trench 38 so that open space of trench 38 overlaps with the open space of the smaller via 26. Similarly, sidewall 34 of via 28 is generally aligned or registered vertically with the sidewalls 46, 48 of trench 40 so that open space of trench 40 overlaps with the open space inside the smaller via 28.

Sidewall 30 of via 26 extends substantially vertically from the bottom 43 of trench 38 to the bottom 31 of via 26, which overlaps with conductive line 14. Similarly, the sidewall 34 of via 28 extends substantially vertically from the bottom 47 of trench 40 to the bottom 35 of via 28, which overlaps partially with conductive line 16 and partially with the dielectric material of the portion 12a of insulating layer 12 adjacent to the conductive line 16.

Collectively, the vias 26, 28 and the trenches 38, 40 define a dual-damascene pattern formed by a via-first, trench-last process sequence as understood by a person having ordinary skill in the art. In an alternative embodiment of the invention, trenches 38, 40 may be formed before vias 26, 28 in a trench-first, via-last process sequence. The ability to perform damascene process steps in either order is familiar to persons having ordinary skill in the art. In addition, insulating layer 24 may consist of separate via level and trench level dielectric layers (not shown) that can be made of the same or different dielectric materials and, in the former case, applied as described herein as a single monolithic insulating layer 24.

Figure 3:
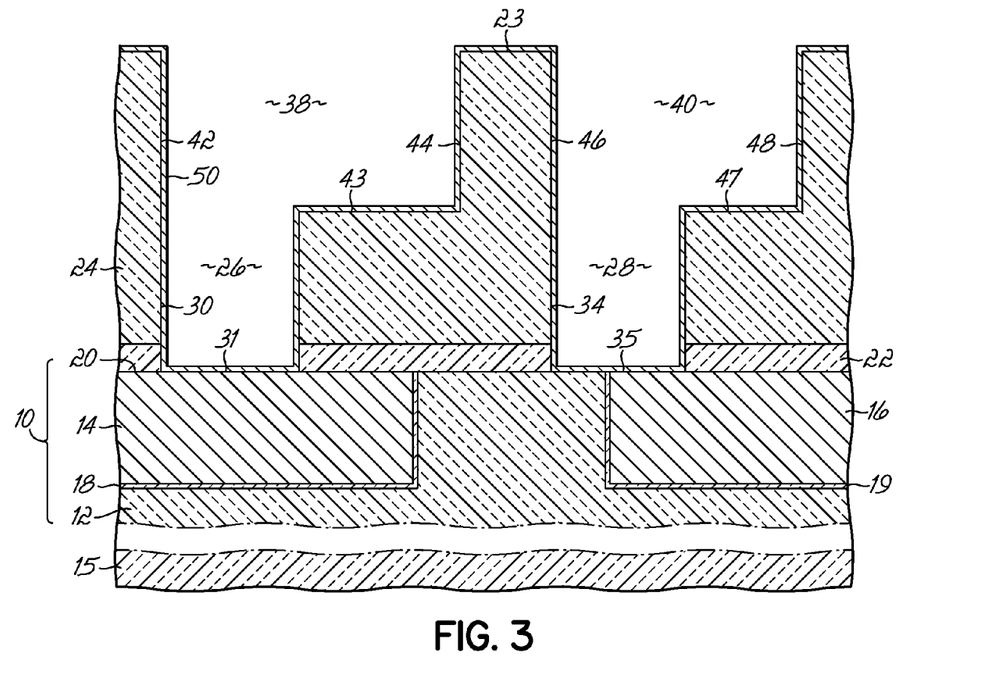
FIGS. 3-7 are diagrammatic cross-sectional views of the substrate portion similar to FIG. 2 taken at successive subsequent fabrication stages of the processing method.

With reference to FIG. 3 in which like reference numerals refer to like features in FIGS. 1 and 2 and at a subsequent fabrication stage, a liner layer 50 is deposited on the top surface 23 of insulating layer 24, the sidewall 30 and bottom 31 of via 26, the sidewall 34 and bottom 35 of via 28, the sidewalls 42, 44 and bottom 43 of trench 38, and the sidewalls 46, 48 and bottom 47 of trench 40. The liner layer 50 may include any suitable material recognized to prevent conductor diffusion into the insulating layer 24, such as TiN, TaN, Ti, TaRu, and other like materials formed utilizing conventional deposition processes well known to those skilled in the art, including but not limited to PVD, iPVD, ALD, plasma-assisted ALD, CVD, and plasma-assisted CVD. Liner layer 50 may also include multilayer combinations of these materials.

Figure 4:
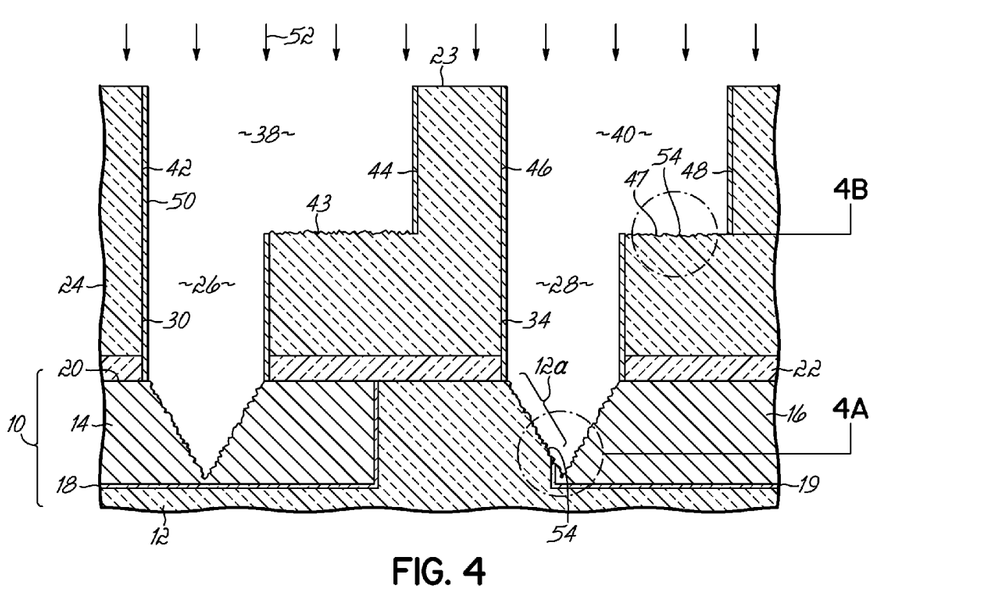
Figure 4A:
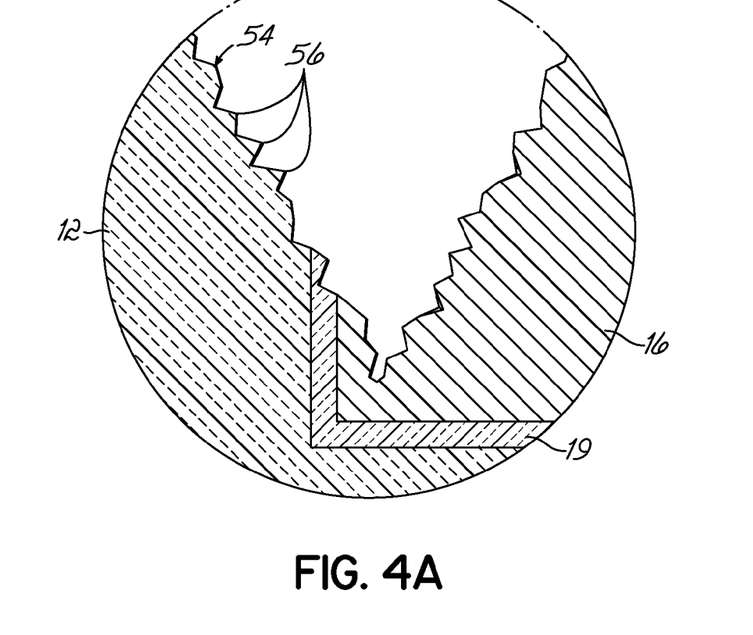
FIGS. 4A and 4B are enlarged detailed views of areas of the substrate portion shown in FIG. 4.
Figure 4B:
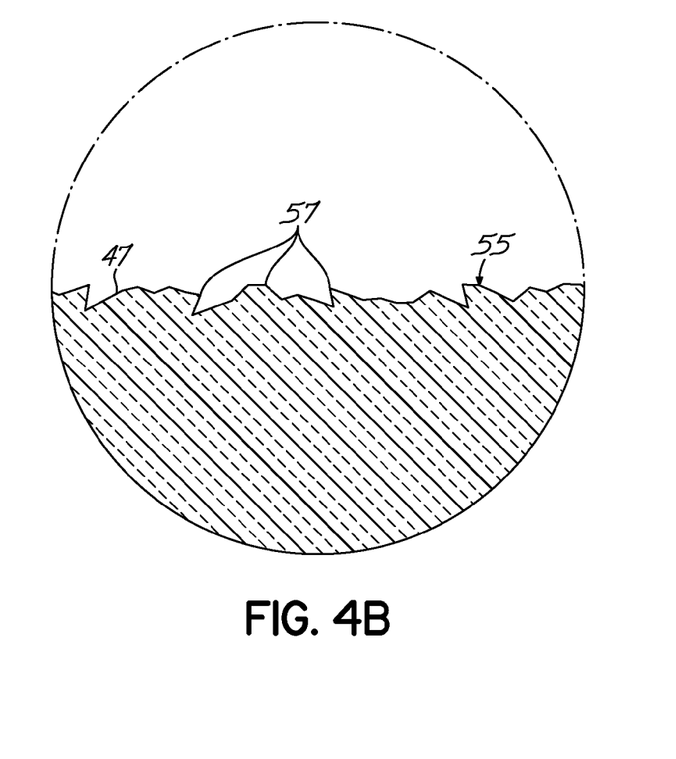

With reference to FIGS. 4, 4A and 4B in which like reference numerals refer to like features in FIG. 3 and at a subsequent fabrication stage, energetic ions 52 are directed to impinge the portion of the conductive line 14 exposed at the bottom 31 of via 26, the portion 12a of the insulating layer 12 and the portion of the conductive line 16 exposed at the bottom 35 of via 28, and the dielectric material of insulating layer 24 exposed at the bottom 43 of trench 38 and the bottom 47 of trench 40. The ion impingement comprises a nonselective sputter etch process in which the ions 52 are generated from an inert working gas, such as argon (Ar), and accelerated to a kinetic energy by applying a negative bias to the substrate 15 as understood by a person having ordinary skill in the art. The kinetic energy of the ions 52 is selected to clean native oxide, and any other contaminants that would detrimentally impact the filling of the vias 26, 28 and trenches 38, 40 with conductive material, from the landed conductive line 14 exposed at the bottom 31 of via 26 and the landed portion of conductive line 16 exposed at the bottom 35 of via 28.

The ions 52, which may have a near normal incidence angle, stop primarily by energy transferred by nuclear collisions of ions 52 to target atoms in conductive lines 14, 16, insulating layers 12, 24, and liner 50. The nuclear collisions displace target atoms from their original lattice sites to generate recoil cascades that dissipate the transferred kinetic energy by displacing additional target atoms. The recoil cascades cause a portion of the target atoms to be sputtered from the entry surface at the bottoms 31, 35 of vias 26, 28 and the bottoms 43, 47 of trenches 38, 40. Sputtered target atoms are ejected or eroded from conductive lines 14, 16 and insulating layers 12, 24. Conductive material sputtered from the conductive lines 14, 16 by ions 52 may re-deposit on the liner layer 50 covering sidewalls 30, 34, 42, 44, 46, 48. Liner layer 50 operates to isolate the dielectric material of insulating layer 24 from this re-deposited conductor. The ion exposure precleans the portions of the conductive lines 14, 16 exposed by the vias 26, 28, respectively, by a sputter etch process.

The sputtering operation is non-selective and typically breaks through the liner layer 50 removes the liner layer 50 disposed on the horizontal bottoms 31, 35 of vias 26, 28, respectively, and the horizontal bottoms 43, 47 of trenches 38, 40, respectively. The erosion extends the depth of the bottom 31 of via 26 with a concave or dished contour into the conductive line 14 and, similarly, extends the bottom 35 of via 28 with a concave or dished contour into the conductive line 16 and adjacent portion 12a of insulating layer 12. The damage from the ions 52 also attacks or roughens the conductor of the conductor lines 14, 16 exposed in vias 26, 28 and the dielectric material of the portion 12a of insulating layer 12 exposed at the bottom 35 of via 28. The damage from ions 52 also attacks or roughens portions of the insulating layer 24 exposed by the bottom 43 of trench 38 and the bottom 47 of trench 40. Low-k dielectric materials in insulating layers 12, 24 may be particularly susceptible to damage from sputtering. The ions 52 also erode and damage the portion of the conductive line 14 exposed by the bottom 31 of via 26 and the portion of the conductive line 16 exposed by the bottom 35 of via 28.

As best shown in FIG. 4A, the roughening creates an irregular surface topography, generally indicated by reference numeral 54, at the bottom 31 of via 26 and also at the bottom 35 of via 28. The irregular surface topography of the dielectric material of the portion 12a of insulating layer 12 is characterized by asperities 56 that project from the bottoms 31, 35 to define alternating convex and concave regions. The asperities 56 may define inverted slopes that are partially shadowed. The roughened surface of the dielectric material of insulating layer 12 degrades the ability to subsequently form a continuous liner in this region for a contact 76 (FIGS. 7, 7A) deposited in via 28.

As best shown in FIG. 4B, the roughening also creates an irregular surface topography, generally indicated by reference numeral 55, at the bottom 43 of trench 38 and the bottom 47 of trench 40. The irregular surface topography is characterized by asperities 57 that project from the bottoms 43, 47 to define alternating convex and concave regions of dielectric material. The asperities 57 may define inverted slopes that are partially shadowed. The roughened surfaces of the dielectric material of insulating layer 24 degrades the ability to subsequently form a continuous liner in these regions for conductive lines 70, 72 (FIGS. 7, 7A) deposited in trenches 38, 40, respectively.

Figure 5:
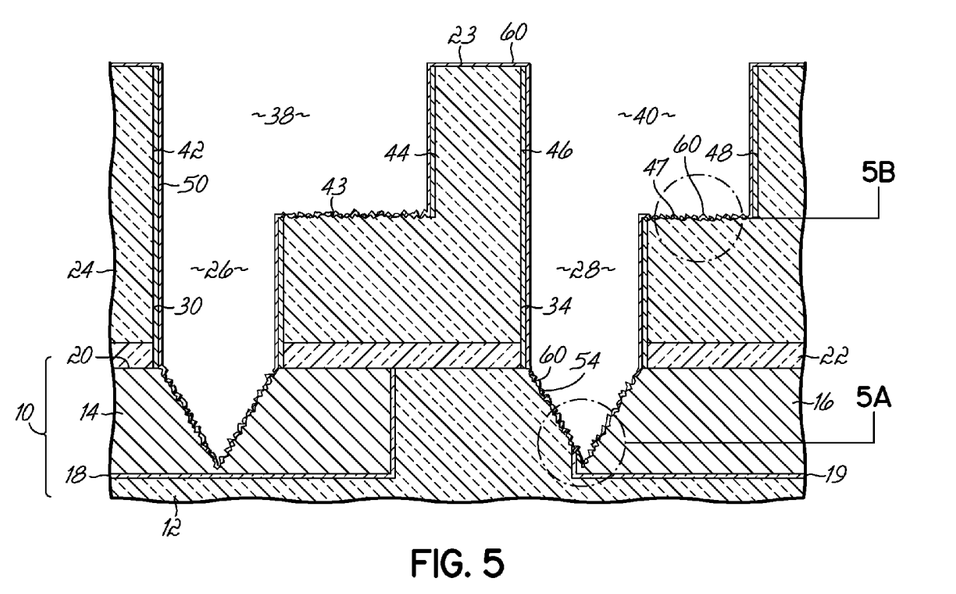
Figure 5A:
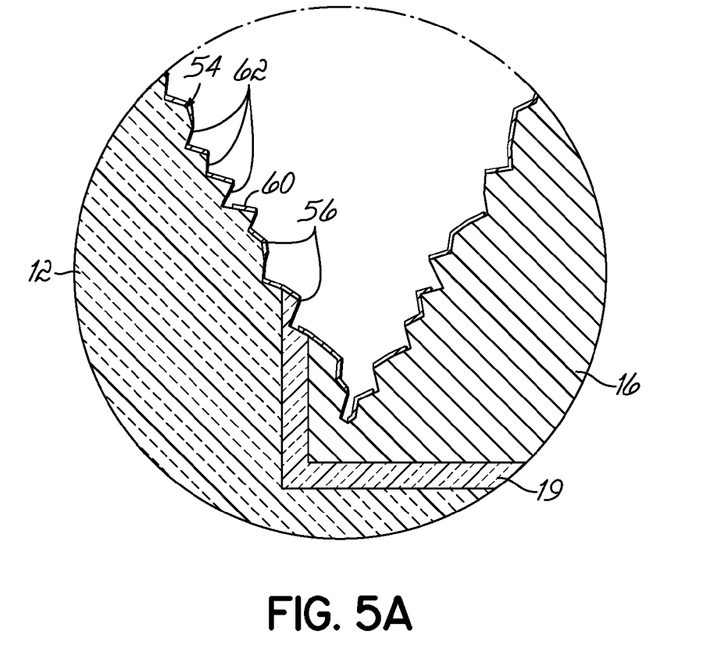
FIGS. 5A and 5B are enlarged detailed views of areas of the substrate portion shown in FIG. 5.
Figure 5B:
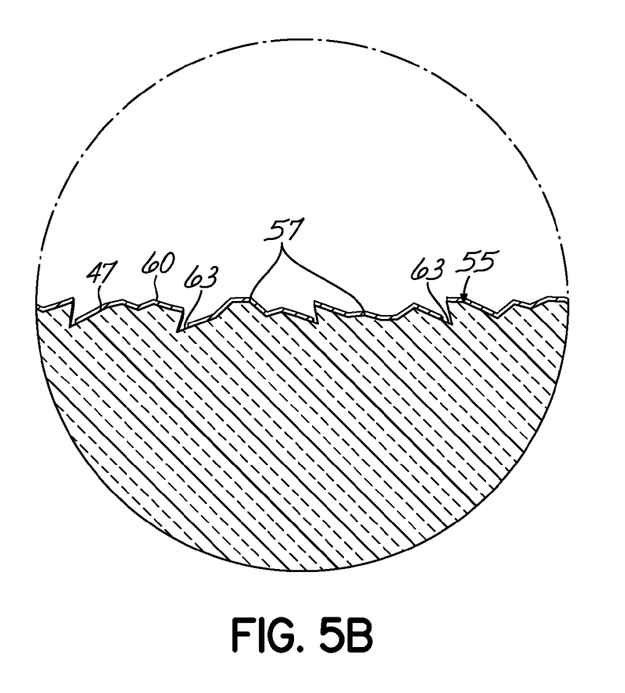

With reference to FIGS. 5, 5A, and 5B in which like reference numerals refer to like features in FIGS. 4, 4A, and 4B and at a subsequent fabrication stage, a liner layer 60 is applied in the vias 26, 28 and trenches 38, 40. Liner layer 60 may comprise a conductive material such as TaN, TiN, Ta, Ti, W, RuTa, ruthenium (Ru), iridium (Ir), rhodium (Rh), platinum (Pt), or another suitable conductive material, deposited, for example, by a PVD process. Liner layer 60 may operate as an adhesion seed for nucleating a liner repair layer 64 (FIGS. 6, 6A, 6B) that is applied in a subsequent fabrication stage and/or as a seed layer for a subsequent metal plating process to fill the vias 26, 28 and trenches 38, 40. Optionally, liner layer 60 may be deposited primarily on the horizontal surfaces by a suitable selective deposition process.

Because of the rough surface caused by the sputter damage of the preclean process, the liner layer 60 exhibits poor coverage. In other words, the liner layer 60 fails to fully coat and cover the asperities 56, 57 of the irregular surface topography. As a result, discontinuities 63 in the form of voids or breaches extend through the liner layer 60, as best shown in FIG. 5B. Discontinuities 63 are distributed at different locations across the bottoms 43, 47 of trenches 38, 40, respectively. Discontinuities 62, which also have the form of voids or breaches, also extend through the liner layer 60 at different locations distributed across the bottom 35 of via 28, as best shown in FIG. 5A. The discontinuities 62, 63 breach the liner layer 60 so that the dielectric material in insulating layers 12, 24 is not fully lined by liner layer 60 and, thus, is exposed by the absence of a barrier film.

Liner layer 60 is not a conformal coating in that the deposited film does not have a uniform thickness because of the geometry of underlying features presented by the asperities 56, 57. The shadowing effect of the asperities 56, 57 prevents conformal coating of these surface features during conventional deposition processes and prevents any attempt to repair the discontinuities 62, 63 by merely increasing the thickness of liner layer 60.

Figure 6:
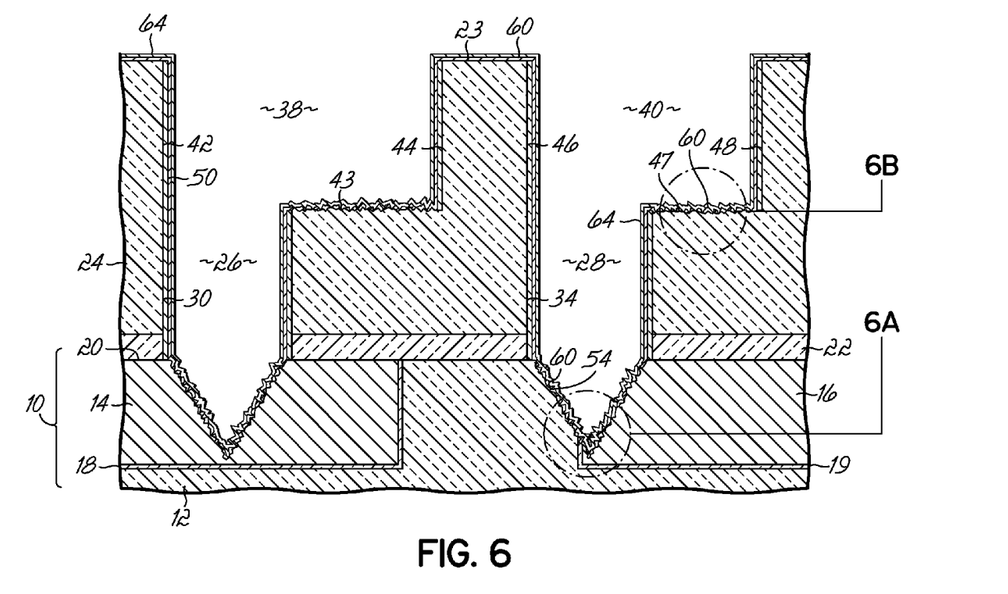
Figure 6A:
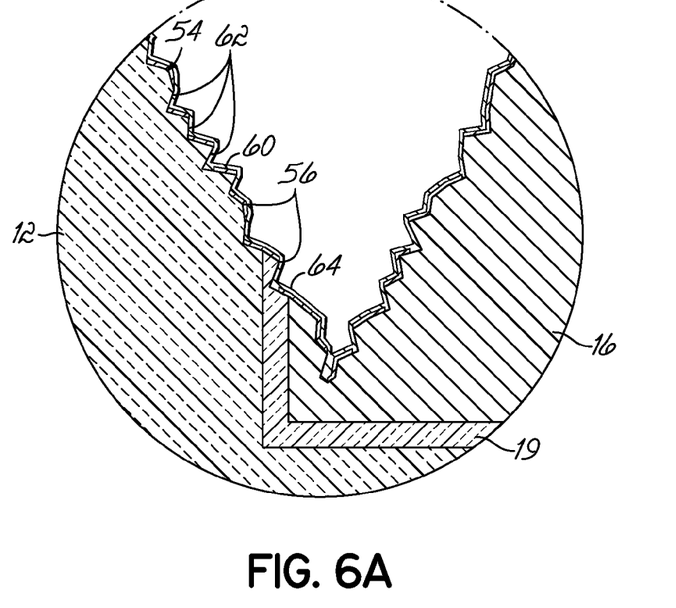
FIGS. 6A and 6B are enlarged detailed views of areas of the substrate portion shown in FIG. 6.
Figure 6B:
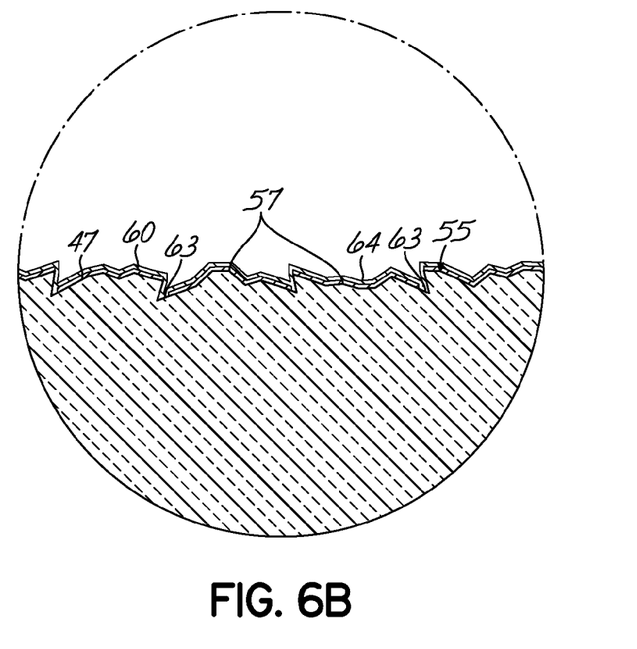

With reference to FIGS. 6, 6A, and 6B in which like reference numerals refer to like features in FIGS. 5, 5A, and 5B and at a subsequent fabrication stage, a liner repair layer 64 is conformally applied on liner layer 60 to define a continuous film or barrier on the bottom 31 and sidewall 30 of via 26, the bottom 35 and sidewall 34 of via 28, the bottom 43 and sidewalls 42, 44 of trench 38, and the bottom 47 and sidewalls 46, 48 of trench 40. In a single process step, liner repair layer 64 repairs the discontinuities 63 in the liner layer 60 to reestablish the barrier isolating the insulating layer 24 from the conductor filling trenches 38, 40 and, moreover, also repairs the discontinuities 62 in the liner layer 60 to seal the dielectric material of the damaged portion 12a (FIG. 4) of insulating layer 12 exposed at the bottom 35 of via 28.

The electrically conductive material constituting the liner repair layer 64 may be deposited by a wet electroless or electroplating process, which is believed to optimize film coverage. In electroless or electroplating deposition, a thin metal film of the conductive material of liner repair layer 64 is formed on surfaces wetted by an aqueous solution by reducing a complex metal ion contained in the aqueous solution. A wet electroless or electroplating process exposes the wetted surfaces to a constant metal ion concentration, which promotes deposition of a continuous thin layer of the cobalt-containing material regardless of surface topography. However, the invention is not so limited as atomic layer deposition (ALD) may be used to deposit liner repair layer 64 if a continuous, conformal film is formed.

The liner repair layer 64 may comprise cobalt-containing material containing elemental cobalt with or without incidental impurities, or cobalt in combination with one or more of the elements tungsten, phosphorus, boron, tin, molybdenum, or another suitable element as an alloy, dopant or non-equilibrium mixture. The microstructural morphology of the cobalt-containing material constituting liner repair layer 64 may be amorphous or polycrystalline.

Figure 7:
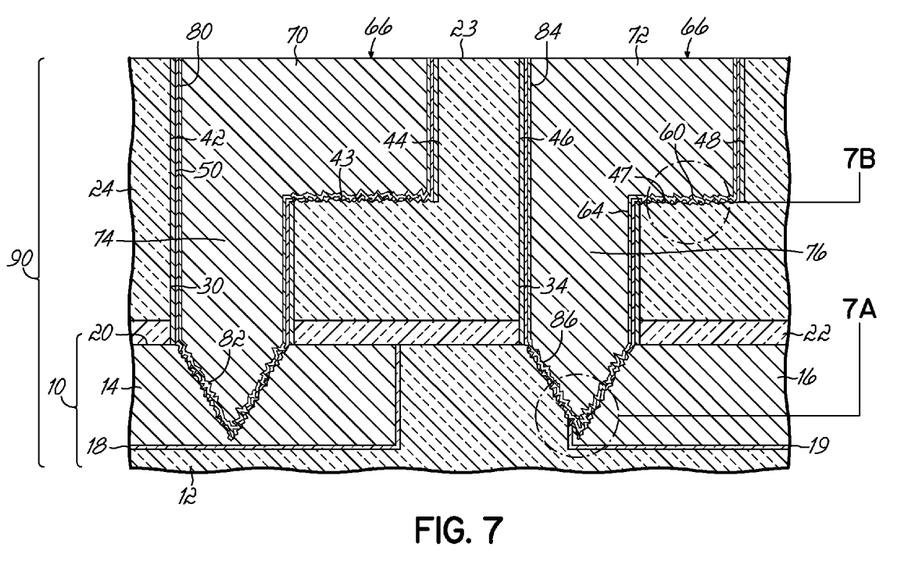
Figure 7A:
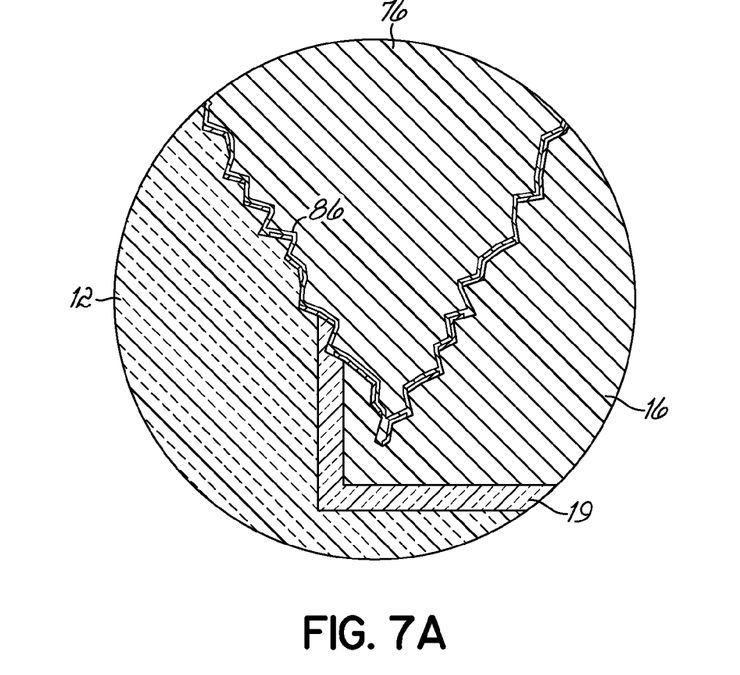
FIGS. 7A and 7B are enlarged detailed views of areas of the substrate portion shown in FIG. 7.
Figure 7B:
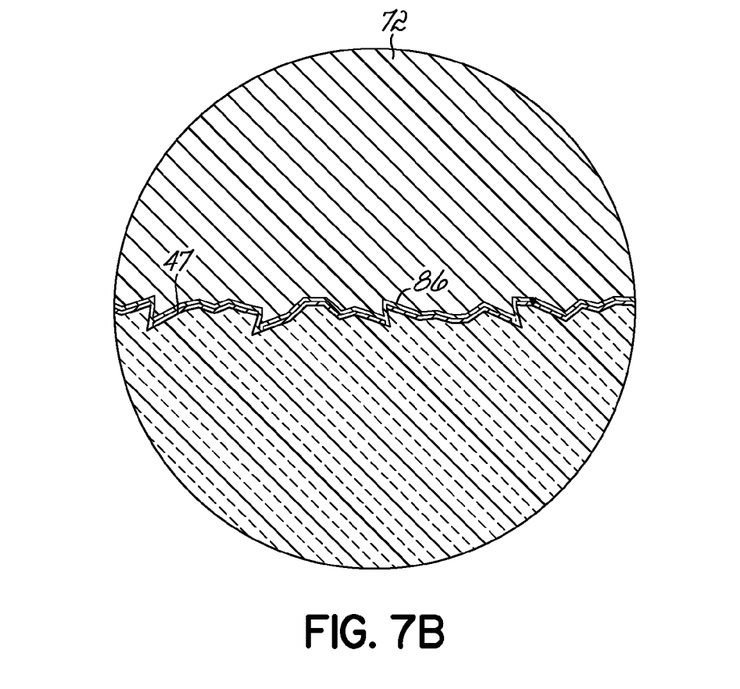

The nominal uniform thickness of liner repair layer 64 may be about 5 nanometers or less, which is significantly thinner than the thickness of liner layer 60 that would be otherwise required to bridge the discontinuities 62, 63 and would thereby limit the volume of conductive material that can fill vias 26, 28 and trenches 38, 40 to form contacts 74, 76 and conductive lines 70, 72 (FIGS. 7, 7A, 7B). The minimized thickness of the liner repair layer 64 is particularly advantageous for 90 nm technology nodes if the via width between sidewalls 30 at bottom 31, the via width between sidewalls 34 at bottom 35, the width between sidewalls 42, 44 at bottom 43, and/or the width between sidewalls 46, 48 at bottom 47 is equal to about 90 nm. This advantage becomes more pronounced for 65 nm and 45 nm technology nodes in which the corresponding widths, which represent critical dimensions, are less than 90 nm. The advantage is particularly important if the dielectric material of insulating layers 12, 24 is characterized by a dielectric constant of about 2.6 or less. Such low-k dielectric materials may be particularly susceptible to damage under ion bombardment.

The liner repair layer 64 is a conformal coating representing a deposited film in which the thickness remains the same regardless of the geometry of underlying features presented by asperities 56, 57. The liner repair layer 64 is not susceptible to a shadowing effect from the asperities 56, 57.

The liner repair layer 64, in conjunction with liner layer 60, promotes complete resealing of the discontinuities 63 in the insulating layer 24 exposed at the bottom 43 of trench 38 and the bottom 47 of trench 40. The liner repair layer 64, in conjunction with liner layer 60, also promotes complete resealing of the discontinuities 62 in the insulating layer 12 exposed at the bottom 35 of via 28 and minimally reduces the area of via 28 because layer 64 is thin. The liner repair layer 64 is compatible with current BEOL processes and achieves the result of repairing the discontinuities 62, 63 without the need for additional photolithography steps.

Liner repair layer 64 satisfies the requirements of scaling down the liner thickness as the technology node scales, while simultaneously repairing poor liner coverage on damaged dielectric surfaces bordering the vias 26, 28 and trenches 38, 40. Liner layer 60, although discontinuous, may promote nucleation during deposition of the cobalt-containing material of liner repair layer 64. However, liner layer 60 may be omitted if sufficient residual material from liner layer 50 remains after bombardment with ions 52 for promoting nucleation of the liner repair layer 64.

With reference to FIGS. 7, 7A, and 7B in which like reference numerals refer to like features in FIGS. 6, 6A, and 6B and at a subsequent fabrication stage, a layer 66 of a conductor, such as a metal like aluminum, an aluminum alloy, copper, or a copper alloy, is blanket deposited on substrate 15 by a suitable deposition technique, such as by plating with electroless or electroplating techniques. Alternatively, the conductive layer 66 may be deposited by a PVD or CVD. After the blanket deposition of the conductive layer 66, portions of the conductor fill the vias 26, 28 and trenches 38, 40 and cover the field of insulating layer 24.

The top surface of conductor layer 66 and layers 50, 60, 64 are made substantially coplanar with the top surface 23 of insulating layer 24 by, for example, a conventional CMP planarization process. The planarization, which slightly recesses the top surface 23, defines individual conductive lines 70, 72 in trenches 38, 40, respectively, and conductive plugs or contacts 74, 76 in vias 26, 28, respectively. Contact 74 electrically couples conductive line 14 with conductive line 70 and contact 76 electrically couples conductive line 16 with conductive line 72. The liner repair layer 64 has a minimized thickness, which maximizes the volume of vias 26, 28 and trenches 38, 40 and, thereby, the volume of the conductive material in conductive lines 70, 72 and contacts 74, 76.

The liner layers 50 and 60, and liner repair layer 64 are transformed by the planarization into a discrete liner 80 between trench 38 and conductive line 70, a discrete liner 82 between via 26 and contact 74, a discrete liner 84 between trench 40 and conductive line 72, and a discrete liner 86 between via 28 and contact 76. Contingent upon the processing and location, each of the liners 80, 82, 84, 86 may contain material from layers 50, 60, and 64. At the least, liners 80, 84 at the bottoms 43, 47 of trenches 38, 40, respectively, include continuous coverage by the conformal liner repair layer 64. Similarly, at the least, the liners 82, 86 at the bottoms 31, 35 of vias 26, 28, respectively, each include continuous coverage by the conformal liner repair layer 64. The continuity of the liner repair layer 64 at the bottoms 43, 47 of trenches 38, 40 repairs the discontinuities 63 in liner layer 60 to prevent future diffusion of the conductor from conductive lines 70, 72 into the dielectric material of insulating layer 24. The continuity of the liner repair layer 64 at the bottom 35 of via 28 repairs the discontinuities 62 in liner layer 60 to prevent diffusion of the conductor from contact 76 into the dielectric material of insulating layer 12. As a result, reliability problems in the form of line-to-line leakage current from diffusion of the conductor into the dielectric materials of insulating layers 12, 24 are either eliminated or, at the least, significantly reduced.

Conductor filling concludes the fabrication of a planarized second interconnect level 90 by damascene back end of line processing. If necessary, the substrate 15 may be heat treated to anneal the conductive material of conductive lines 70, 72 and contacts 74, 76 before subsequent process steps. The heat treatment may be performed in either an inert or vacuum environment, where an inert environment may comprise, for example, a non-reactive atmosphere of helium (He), Ar, or nitrogen ($N_2$). In particular, annealing copper increases the grain size to improve electromigration reliability and promote bonding with liners 60, 64.

The completed second interconnect level 90 may be reproduced or replicated across the surface of substrate 15 by the fabrication procedure described in FIGS. 1-7. Additional interconnect levels, each similar or identical to the completed interconnect level 90, may be stacked above the completed interconnect level 90 by following a fabrication process identical or similar to that illustrated in FIGS. 1-7.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the invention without departing from the spirit and scope of the invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An interconnect structure formed on a substrate, comprising:
   an insulating layer of a dielectric material overlying the substrate;
   a trench having sidewalls extending partially through the insulating layer and a bottom that opens on a roughened portion of the dielectric material;
   a conductive line disposed in the trench;
   a liner layer disposed on the bottom of the trench and between the insulating layer and the conductive line, the liner layer including a plurality of discontinuities distributed across the roughened portion of the dielectric layer; and
   a conformal liner repair layer of a conductive material bridging the discontinuities in the liner layer.

2. The interconnect structure of claim 1 wherein the dielectric material of the insulating layer has a dielectric constant of about 2.6 or less.

3. The interconnect structure of claim 1 wherein the conductive material of the liner repair layer comprises a cobalt-containing material.

4. The interconnect structure of claim 3 wherein the cobalt-containing material comprises elemental cobalt, or cobalt and at least one element selected from the group consisting of tungsten, phosphorus, boron, tin, and molybdenum.

5. The interconnect structure of claim 1 wherein the roughened portion of the dielectric material includes asperities at the bottom of the trench that are correlated spatially with the discontinuities in the liner layer.

6. The interconnect structure of claim 1 further comprising:
   a via having a sidewall extending through the insulating layer from the bottom of the trench to another conductive line between the insulating layer and the substrate; and
   a contact of a conductive material disposed in the via, said contact electrically coupling the conductive line with another conductive line disposed between the substrate and the insulating layer.

7. The interconnect structure of claim 1 where the liner layer further includes an unbroken film on the sidewalls of the trench between the insulating layer and the conductive line, and the conformal layer is further disposed on the sidewalls of the trench between the liner layer and the conductive line.

8. The interconnect structure of claim 1 wherein the conformal layer has a thickness of less than or equal to about 5 nanometers, and a width between the sidewalls at the bottom of the trench is less than or equal to about 90 nanometers.

9. An interconnect structure formed on a substrate, comprising:
   a first insulating layer of a first dielectric material overlying the substrate;
   a second insulating layer of a second dielectric material separated from the substrate by the first insulating layer;
   a first conductive line in the first insulating layer;
   a via having a bottom and a sidewall extending through the second insulating layer to the bottom, the bottom of the via overlapping a portion of the first conductive line and a roughened portion of the first dielectric material of the first insulating layer adjacent to the first conductive line;
   a conductive contact disposed in the via, the contact electrically coupled with the first conductive line;
   a liner layer on the bottom of the via between the portion of the first insulating layer and the contact, the liner layer including a plurality of discontinuities distributed across the roughened portion of the first dielectric material; and
   a conformal liner repair layer of a conductive material bridging the discontinuities in the liner layer.

10. The interconnect structure of claim 9 wherein the first dielectric material of the second insulating layer has a dielectric constant of about 2.6 or less.

11. The interconnect structure of claim 9 wherein the second dielectric material of the first insulating layer has a dielectric constant of about 2.6 or less.

12. The interconnect structure of claim 9 wherein the conductive material of the liner repair layer comprises a cobalt-containing material.

13. The interconnect structure of claim 12 wherein the cobalt-containing material comprises elemental cobalt, or cobalt and at least one element selected from the group consisting of tungsten, phosphorus, boron, tin, and molybdenum.

14. The interconnect structure of claim 9 wherein the roughened portion of the first dielectric material includes asperities at the bottom of the via that are correlated spatially with the discontinuities in the liner layer.

15. The interconnect structure of claim 9 wherein the conformal layer has a thickness of less than or equal to about 5 nanometers, and a width of the bottom of the via is less than or equal to about 90 nanometers.

16. The interconnect structure of claim 9 further comprising:
   a trench disposed in the second insulating layer and in communication with the via; and
   a second conductive line disposed in the trench, the second conductive line physically separated by the second insulating layer from the first conducting line, and the first and second conductive lines electrically coupled by the contact.

17. A method of forming an interconnect structure on a substrate, comprising:
   forming a trench having sidewalls extending partially through a first insulating layer of a dielectric material overlying the substrate and a bottom that opens on a roughened portion of the dielectric material of the first insulating layer;
   at least partially covering the bottom of the trench with a first liner layer having a plurality of discontinuities that expose the dielectric material of the first insulating layer;
   conformally forming a liner repair layer that bridges the discontinuities in the first liner layer; and forming a first conductive line in the trench that is separated from the dielectric material of the first insulating layer at the bottom of the trench by at least the conformal liner repair layer.

18. The method of claim 17 wherein at least partially covering the bottom of the trench with the first liner layer further comprises:
   forming the first liner layer on the bottom of the trench; and
   at least partially removing the first liner layer from the bottom of the trench by a sputter etching process to define the discontinuities.

19. The method of claim 18 wherein at least partially covering the bottom of the trench with the first liner layer further comprises:
   forming the first liner layer on the bottom and the sidewalls of the trench; and
   at least partially removing the first liner layer from the bottom of the trench by a sputter etching process to define the discontinuities.

20. The method of claim 17 wherein at least partially covering the bottom of the trench with the first liner layer further comprises:
   forming a second liner layer on the bottom and the sidewalls of the trench;
   removing the second liner layer from the bottom of the trench by a sputter etching process that roughens the dielectric material of the first insulating layer after the second liner is removed; and
   depositing the first liner layer on the roughened dielectric material of the first insulating layer to define the discontinuities.

21. The method of claim 17 further comprising:
   forming a via having sidewalls extending from the bottom of the trench to a bottom exposing a second conductive line in a second insulating layer disposed between the insulating layer and the substrate before at least partially covering the bottom of the trench with the first liner layer.

22. The method of claim 17 wherein conformally forming the liner repair layer further comprises:
   depositing a conformal coating of a cobalt-containing material on the bottom of the trench.

23. A method of forming an interconnect structure on a substrate, comprising:
   forming a first insulating layer of a dielectric material overlying the substrate and a conductive line in the dielectric material of the first insulating layer;
   depositing a second insulating layer of a dielectric material overlying the substrate;
   forming a trench in the second insulating layer having sidewalls extending partially through the second insulating layer and a bottom that opens on the dielectric material of the second insulating layer;
   forming a via having via sidewalls extending from the bottom of the trench to a via bottom partially exposing the conductive line and partially exposing a roughened portion of the first insulating layer adjacent to the conductive line;
   at least partially covering the via bottom with a first liner layer having a plurality of discontinuities that expose the dielectric material of the first insulating layer;
   conformally forming a liner repair layer of a cobalt-containing material that bridges the discontinuities in the first liner layer; and
   forming a first conductive contact in the via that is separated from the dielectric material of the first insulating layer at the bottom of the via by at least the conformal liner repair layer.

24. The method of claim 23 wherein at least partially covering the via bottom with the first liner layer further comprises:
   forming the first liner layer on the via bottom; and
   at least partially removing the first liner layer from the via bottom by a sputter etching process to define the discontinuities.

25. The method of claim 23 wherein at least partially covering the via bottom with the first liner layer further comprises:
   forming the first liner layer on the via bottom and the via sidewalls; and
   at least partially removing the first liner layer from the via bottom by a sputter etching process to define the discontinuities.

26. The method of claim 23 wherein at least partially covering the via bottom with the first liner layer further comprises:
   forming a second liner layer on the via bottom and the via sidewalls;
   removing the second liner from the via bottom by a sputter etching process that roughens the dielectric material of the first insulating layer after the second liner is removed; and
   depositing the first liner layer on the roughened dielectric material of the first insulating layer to define the discontinuities.

27. The method of claim 23 wherein conformally forming the liner repair layer further comprises:
   depositing a conformal coating of a cobalt-containing material on the via bottom.

* * * * *